United States Patent
Leenders et al.

(10) Patent No.: US 8,564,760 B2
(45) Date of Patent: *Oct. 22, 2013

(54) LITHOGRAPHIC APPARATUS, DEVICE MANUFACTURING METHOD AND A CONTROL SYSTEM

(75) Inventors: Martinus Hendrikus Antonius Leenders, Rotterdam (NL); Sjoerd Nicolaas Lambertus Donders, Vught (NL); Nicolaas Rudolf Kemper, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 260 days.

This patent is subject to a terminal disclaimer.

(21) Appl. No.: 12/904,617

(22) Filed: Oct. 14, 2010

(65) Prior Publication Data

US 2011/0025995 A1 Feb. 3, 2011

Related U.S. Application Data

(63) Continuation of application No. 11/319,215, filed on Dec. 28, 2005, now Pat. No. 7,839,483.

(51) Int. Cl.
| | |
|---|---|
| G03B 27/42 | (2006.01) |
| B01D 57/02 | (2006.01) |
| B01D 59/42 | (2006.01) |
| B01D 59/50 | (2006.01) |
| B01D 61/42 | (2006.01) |
| B01D 61/58 | (2006.01) |
| C02F 1/469 | (2006.01) |
| C07K 1/26 | (2006.01) |
| C08F 2/58 | (2006.01) |
| C25B 15/00 | (2006.01) |
| C25B 7/00 | (2006.01) |
| G01F 1/64 | (2006.01) |
| G01L 1/20 | (2006.01) |
| G01L 9/18 | (2006.01) |

(52) U.S. Cl.
USPC .................................... 355/53; 204/451

(58) Field of Classification Search
USPC .......................... 355/30, 53; 204/450, 451
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

Japanese Office Action mailed Apr. 3, 2012 in corresponding Japanese Patent Application No. 2010-093083.

(Continued)

*Primary Examiner* — William C Dowling
*Assistant Examiner* — Ryan Howard
(74) *Attorney, Agent, or Firm* — Pillsbury Winthrop Shaw Pittman LLP

(57) ABSTRACT

A capillary passage is formed between a substrate holder and an edge structure. Along the capillary passage are arranged a plurality of electrodes which, when charged, become liquid-philic. The electrodes may be used to split droplets of liquid and pump the liquid along the capillary passage.

20 Claims, 4 Drawing Sheets

(56) References Cited

U.S. PATENT DOCUMENTS

| | | | |
|---|---|---|---|
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,846,396 A | 12/1998 | Zanzucchi et al. | |
| 5,900,354 A | 5/1999 | Batchelder | 430/395 |
| 6,120,665 A | 9/2000 | Chiang et al. | |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 7,458,783 B1 | 12/2008 | Myers et al. | |
| 7,684,008 B2 | 3/2010 | De Smit et al. | |
| 7,839,483 B2 | 11/2010 | Leenders et al. | |
| 2002/0020821 A1 | 2/2002 | Van Santen et al. | 250/492 |
| 2002/0070116 A1 | 6/2002 | Ohkawa | |
| 2002/0163629 A1 | 11/2002 | Switkes et al. | 355/53 |
| 2003/0123040 A1 | 7/2003 | Almogy | 355/69 |
| 2003/0203245 A1 | 10/2003 | Dessiatoun et al. | |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0174549 A1 | 8/2005 | Duineveld et al. | |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219488 A1 | 10/2005 | Nei et al. | |
| 2005/0219489 A1 | 10/2005 | Nei et al. | 355/53 |
| 2005/0233081 A1 | 10/2005 | Tokita | 427/256 |
| 2006/0023187 A1 | 2/2006 | Eaton | |
| 2006/0054227 A1 | 3/2006 | Sohn | |
| 2007/0109521 A1 | 5/2007 | Nishii et al. | |
| 2007/0146666 A1 | 6/2007 | Leenders et al. | |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A3 | 5/2004 |
| EP | 1 420 300 A3 | 8/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-005713 | 1/2005 |
| JP | 2005-183744 | 7/2005 |
| JP | 2005-223342 | 8/2005 |
| JP | 2006-523022 | 10/2006 |
| JP | 2007-019392 | 1/2007 |
| JP | 4514747 | 7/2010 |
| JP | 2010-183101 | 8/2010 |
| JP | 2010-183114 | 8/2010 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO2004-086470 | 10/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |
| WO | WO 2005-057636 | 6/2005 |

OTHER PUBLICATIONS

Japanese Office Action mailed Apr. 3, 2012 in corresponding Japanese Patent Application No. 2010-116596.

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

(56) References Cited

OTHER PUBLICATIONS

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et ai., "Immersion Optical Lithography at 193nm", Future FAB International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al. "⅛μm Optical Lithography", J. Vac. Sci. Technol, B., Vol, 10, No. 6, Nov./Dec. 1992, pp. 3032-3036.
Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193 nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
Japanese Office Action dated Oct. 14, 2009 for Appl. No. 2006-343648.

LITHOGRAPHIC APPARATUS, DEVICE MANUFACTURING METHOD AND A CONTROL SYSTEM

This application is a continuation of U.S. patent application Ser. No. 11/319,215, filed Dec. 28, 2005, now allowed, which is incorporated herein in its entirety by reference.

1. FIELD

The present invention relates to a lithographic apparatus, a method for manufacturing a device and a control system to control a lithographic apparatus.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member 12 which extends along at least a part of a boundary of the space between the final element of the projection system PL and the substrate table, as depicted in FIG. 5. Liquid 11 is supplied through an inlet/outlet 13. The barrier member is substantially stationary relative to the projection system in the XY plane though there may be some relative movement in the Z direction (in the direction of the optical axis). A seal 16 is formed between the barrier member and the surface of the substrate. In an embodiment, the seal is a contactless seal such as a gas seal 14, 15. Such a system with a gas seal is disclosed in U.S. patent application publication no. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

3. SUMMARY

In an embodiment, immersion liquid is extracted via an extraction conduit around the substrate table and/or one or more sensors. However, immersion liquid and gas (e.g., air) may become trapped in the conduit. A suction force may be applied to the extraction conduit, which creates a flow of gas. To account for variations in the conduit, a large suction force may be required. The passing gas may cause evaporation of the immersion liquid which in turn cools the extraction conduit and possibly part of the substrate and/or substrate table.

The degree of cooling is affected by the amount of immersion liquid adhering to the extraction conduit, the surface area of the extraction conduit exposed to the gas flow, the velocity of the gas and/or the relative humidity of the gas. Unfortunately, the cooling may cause deformation of the substrate edge and/or substrate table. This may cause errors in alignment and overlay. Furthermore, the cooling pattern, and thus the deformation, may vary between lithographic apparatus so errors in alignment between lithographic apparatus may be increased.

It is desirable, for example, to reduce cooling due to the extraction of immersion liquid.

According to an aspect of the invention, there is provided an immersion lithographic apparatus comprising an extraction conduit arranged to remove liquid along a flow direction, the extraction conduit comprising a capillary passage formed by a plurality of surfaces, the capillary passage having a plurality of electrodes on the surfaces.

According to a further aspect of the invention, there is provided an immersion lithographic apparatus comprising a plurality of electrodes arranged on a surface configured to be in contact with liquid.

According to a further aspect of the invention, there is provided a device manufacturing method, comprising:

supplying liquid to a space between a projection system and a substrate;

extracting liquid through an extraction conduit along a flow direction, the extraction conduit comprising a capillary passage formed by a plurality of surfaces, the capillary passage having a plurality of electrodes on the surfaces, the extracting comprising applying a voltage to at least one of the electrodes; and projecting a projection beam of radiation, using the projection system, through liquid onto the substrate.

According to a further aspect of the invention, there is provided a control system configured to control a plurality of electrodes arranged in an immersion lithographic apparatus, the electrodes configured to be in contact with or in close proximity to liquid in the immersion lithographic apparatus.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
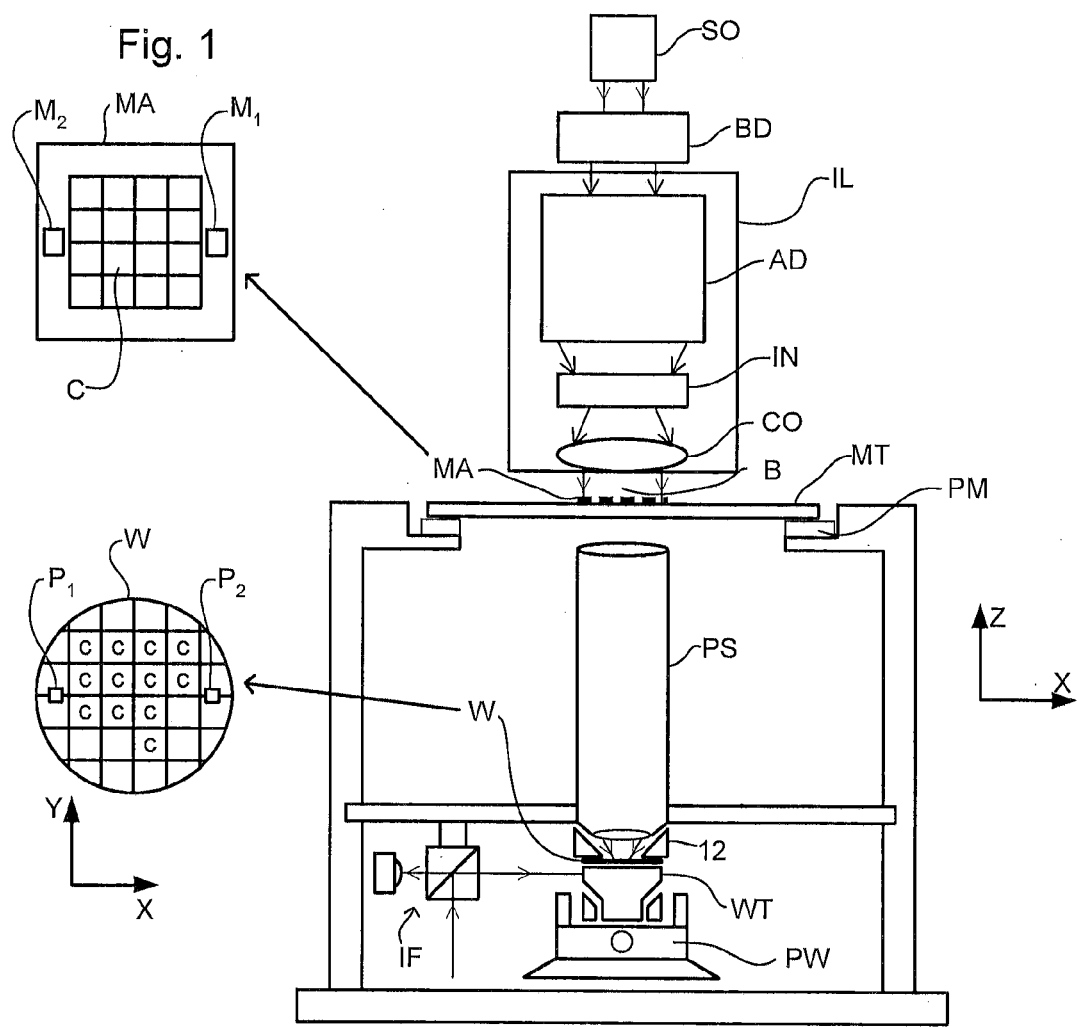
FIG. 1 depicts a lithographic apparatus according to an embodiment of the invention.
Figure 2:
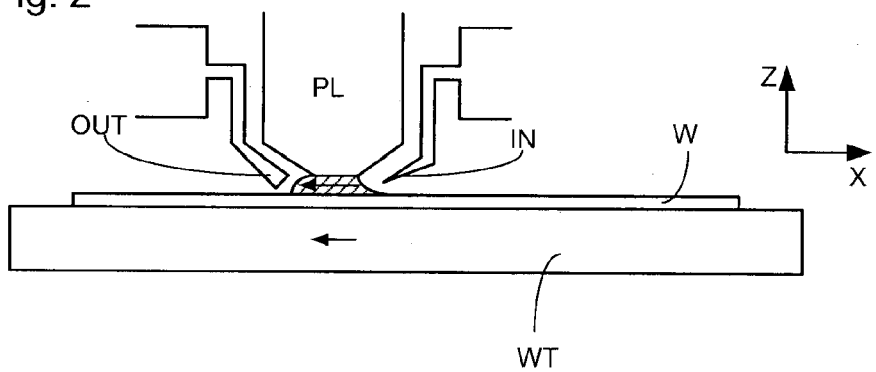
FIGS. 2 and 3 depict a liquid supply system for use in a lithographic projection apparatus.
Figure 3:
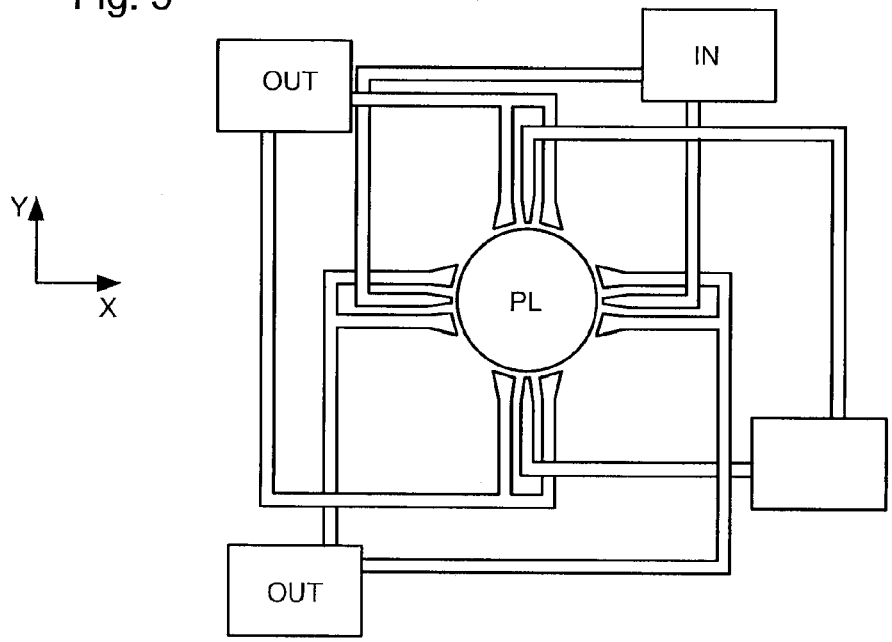
Figure 4:
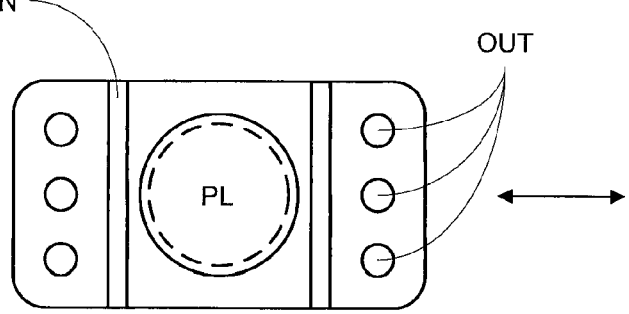
FIG. 4 depicts another liquid supply system for use in a lithographic projection apparatus.
Figure 4:
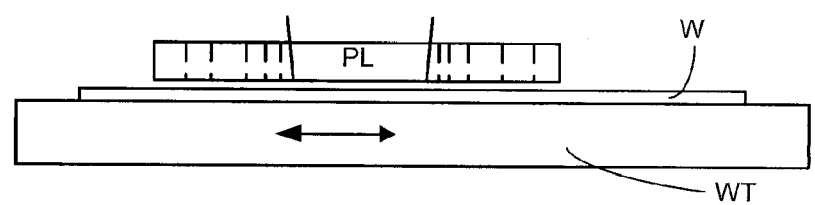
Figure 5:
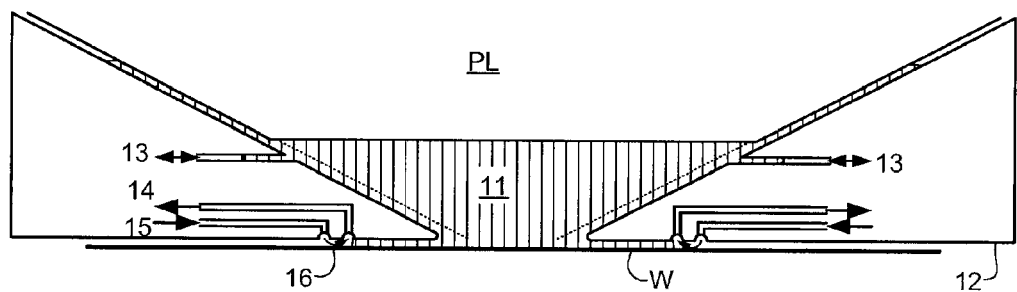
FIG. 5 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 6:
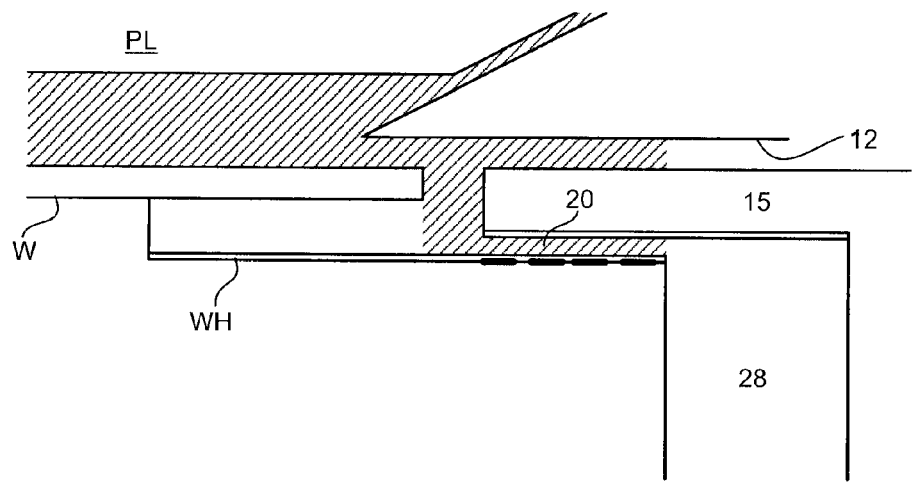
FIG. 6 depicts a first embodiment of the invention.
Figure 7:
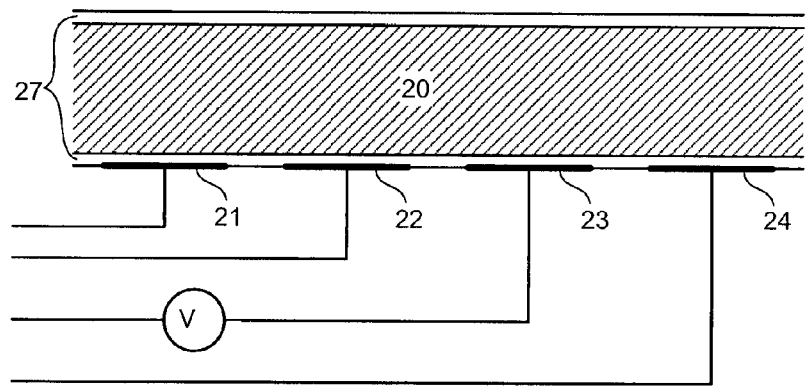
FIG. 7 is a detailed view of a first embodiment of the invention.

According to an embodiment of the invention, a liquid (e.g., water) pump is formed in an extraction conduit. As can be seen from FIG. 6, a thin capillary passage 20 between the substrate holder WH and the edge structure 15 is created, the edge structure being adjacent the substrate when on the substrate holder WH and, in an embodiment, having a top surface substantially co-planar with a top surface of the substrate. In an embodiment, the edge structure 15 helps to seal a gap between the substrate W and the substrate table or holder. The capillary passage is sufficiently thin, or narrow, that capillary forces will draw immersion liquid along the capillary passage. The gap between the substrate holder WH and the substrate edge structure 15 along the capillary passage is very small, in an embodiment less than 500 μm or between 80-100 μm. Along the capillary passage 20 are arranged a plurality of electrodes 21, 22, 23, 24. As can be seen, the electrodes are, in this embodiment, arranged consecutively in a direction substantially parallel to the direction in which the immersion liquid will flow towards the chamber 28, which may have an underpressure. Each of the electrodes is separated by a small gap and the size of the electrodes may be governed by the size of the droplets in the capillary passage. In an embodiment, the electrodes should be less than half the size of the droplets. For example, a capillary passage of dimensions 0.5 mm×1 mm would result in droplets of approximately 1 mm and therefore an electrode of less than 0.5 mm in the direction substantially parallel to the direction in which immersion liquid flows towards the chamber 28. So, for example, there is a distance of approximately 0.5 mm between the center of each electrode. However, a smaller capillary passage would result in smaller droplets and therefore should have smaller electrodes.

Figure 8:
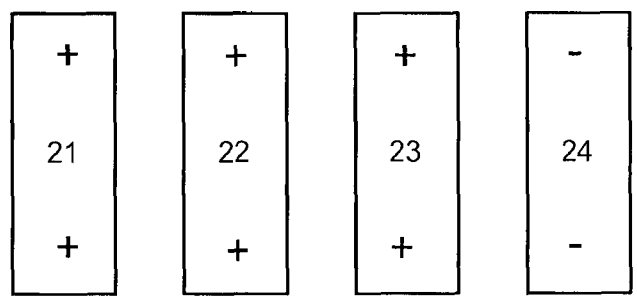
FIG. 8 is a plan view of an arrangement of electrodes according to a first embodiment of the invention.

Although depicted as being on the substrate holder edge of the capillary passage, the electrodes could equally well be arranged on the substrate edge structure 15 or indeed on both the substrate holder WH and the edge structure 15. According to an embodiment, the electrodes and optionally the entire capillary passage are covered by a thin layer of a liquidphobic (e.g., hydrophobic) material 27, for example, Teflon chemical, a fluoropolymer or a suitable ceramic. Each of the electrodes is connected to a voltage source V (either positive or negative) and when a voltage is applied to an electrode the surface becomes liquidphilic. This can be used to split droplets of liquid and thus pump them along the capillary passage towards the chamber 28 where the immersion liquid is removed. High velocities, for example up to 100 mm/sec of liquid flow, may be generated in this way. To obtain optimum pumping action, the electrodes are, in an embodiment, a maximum of half of the desired droplet size. As the gas flow is reduced, the evaporation and thus the cooling is also reduced. In FIG. 8, a possible arrangement of electrodes is shown. As can be seen, there are three adjacent electrodes 21, 22, 23 to which a positive voltage has been applied, the electrodes 21, 22, 23, 24 arranged in a direction of the flow direction. Further, each electrode extends in a direction substantially perpendicular to the flow direction. Applying a similar voltage to adjacent electrodes can be used to achieve higher fluid volumes through the capillary passage. To improve the conductivity of the immersion liquid, an additive with a high ionic content could be added to the immersion liquid, for example, dissolved carbon dioxide.

Figure 9:
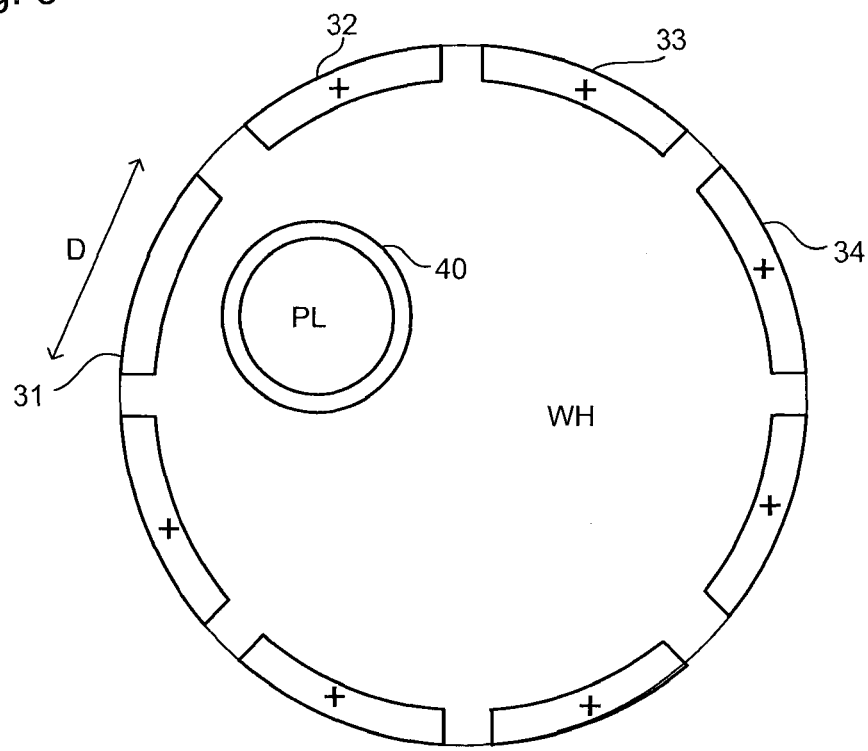
FIG. 9 depicts a second embodiment of the invention.

According to a second embodiment, shown in FIG. 9, the electrodes are not arranged in a direction substantially parallel to the flow of the immersion liquid towards the chamber but tangentially around the substrate holder WH (i.e., in a direction substantially perpendicular to the flow direction). Thus, the capillary passage is formed in the shape of an annulus (circular or other shape) such that the liquid flows in the direction from the inside of the annulus to the outside of the annulus. In an embodiment, the tangential arrangement of electrodes around the substrate holder WH could be used to pump immersion liquid in a tangential direction around the substrate holder WH and the point(s) of immersion liquid extraction thus controlled in addition to the extraction of gas bubbles. For example, as shown in FIG. 9, no voltage is applied to the electrode 31 adjacent to the projection system PL and liquid supply system 40. In contrast, 25V has been applied to the other electrodes 32, 33, 34 surrounding the substrate holder WH. Thus the part of the capillary passage adjacent to the liquid supply system is dry whereas the other parts of the capillary passage are liquidphilic and thus filled with immersion liquid. This reduces the surface area of the immersion liquid exposed to gas and the gas consumption is reduced. In this embodiment, segments of the capillary passage having a width D approximately equal to the width/diameter of the liquid supply system or projection system are operated as a unit to control the point of immersion liquid extraction. Due to the reduced gas flow, smaller gas hoses may be needed and so there is less coupling between the substrate table and other parts of the apparatus.

A controller (not shown) may be provided for the embodiments described herein to control the voltage applied to each electrode, in an embodiment the controller able to control the voltage of each electrode individually.

Although in the examples illustrated the extraction conduit is arranged around the outside of the substrate holder WH, the extraction conduit could be used in any part of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
an optical projection system; and
an extraction conduit arranged to remove liquid along a flow direction, the extraction conduit having a plurality of electrodes arranged consecutively in the flow direction, each of the electrodes having a surface extending in the flow direction, wherein the electrodes, in use, come in contact with two phase fluid comprising gas and the liquid.

2. The apparatus according to claim 1, further comprising a substrate holder and wherein the extraction conduit is arranged around the outside of the substrate holder.

3. The apparatus according to claim 1, wherein the extraction conduit further comprises a chamber into which the liquid is extracted.

4. The apparatus according to claim 3, wherein the chamber has, in use, a suction therein.

5. The apparatus according to claim 1, wherein the extraction conduit has a smallest dimension of less than 500 microns.

6. The apparatus according to claim 1, wherein there are spaces not occupied by an electrode between the electrodes.

7. The apparatus according to claim 1, wherein the plurality of electrodes are arranged in the shape of an annulus such that the liquid flows from the inside of the annulus to the outside of the annulus.

8. The apparatus according to claim 1, wherein the two-phase fluid comprises a droplet in a gaseous environment.

9. An immersion lithographic apparatus comprising:
an optical projection system; and
an extraction conduit arranged to remove liquid along a flow direction, the extraction conduit comprising a passage having a plurality of electrodes, the electrodes covered by a layer of liquidphobic material,
wherein the electrodes, in use, come in contact with two phase fluid comprising gas and the liquid.

10. The apparatus according to claim 9, wherein the liquidphobic material comprises a fluoropolymer.

11. The apparatus according to claim 9, wherein the electrodes are arranged consecutively in the flow direction, each of the electrodes having a surface extending in the flow direction.

12. The apparatus according to claim 9, wherein the two-phase fluid comprises a droplet in a gaseous environment.

13. An immersion lithographic apparatus comprising:
an optical projection system;
a substrate holder; and
a plurality of electrodes arranged on a surface configured to be in contact with liquid, the plurality of electrodes arranged around the outside of the substrate holder, wherein the electrodes, in use, come in contact with two phase fluid comprising gas and the liquid.

14. The apparatus according to claim 13, wherein the electrodes are arranged in a second direction substantially perpendicular to a flow direction of the liquid across the electrodes.

15. The apparatus according to claim 13, wherein the plurality of electrodes are arranged in the shape of an annulus such that the liquid flows from the inside of the annulus to the outside of the annulus.

16. The apparatus according to claim 13, wherein the two-phase fluid comprises a droplet in a gaseous environment.

17. An immersion lithographic apparatus comprising:
an optical projection system;
an extraction conduit arranged to remove liquid, the extraction conduit comprising a plurality of electrodes, wherein the conduit and the plurality of electrodes are arranged in the shape of an annulus such that the liquid flows in a direction from the inside of the annulus toward the outside of the annulus; and
a controller configured to control application of voltage to at least one of the electrodes to cause the liquid to flow in a direction tangential to the annulus.

18. The apparatus according to claim 17, wherein the electrodes, in use, come in contact with two phase fluid comprising gas and the liquid.

19. The apparatus according to claim 17, wherein there are spaces not occupied by an electrode between the electrodes.

20. The apparatus according to claim 17, wherein each electrode has a length approximately equal to a diameter of the projection system.

* * * * *